United States Patent
Jung et al.

(10) Patent No.: US 11,129,278 B2
(45) Date of Patent: Sep. 21, 2021

(54) CAMERA MODULE HAVING ELASTICITY AND MOBILE DEVICE WITH THE SAME

(71) Applicant: Samsung Electronics Co., Ltd., Suwon-si (KR)

(72) Inventors: Hwajoong Jung, Suwon-si (KR); Manho Kim, Suwon-si (KR); Youngseok Kim, Suwon-si (KR); Hyungjin Rho, Suwon-si (KR); Chiyoung Park, Suwon-si (KR); Taeyun Kim, Suwon-si (KR); Yonghwan Choi, Suwon-si (KR); Kihuk Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 99 days.

(21) Appl. No.: 16/206,029

(22) Filed: Nov. 30, 2018

(65) Prior Publication Data

US 2019/0208638 A1 Jul. 4, 2019

(30) Foreign Application Priority Data

Jan. 2, 2018 (KR) .................. 10-2018-0000103

(51) Int. Cl.
*G02B 7/02* (2021.01)
*H05K 1/18* (2006.01)
(Continued)

(52) U.S. Cl.
CPC ............. *H05K 1/181* (2013.01); *G02B 7/021* (2013.01); *G03B 17/02* (2013.01); *H05K 1/111* (2013.01);
(Continued)

(58) Field of Classification Search
CPC ... G02B 3/14; G02B 7/09; G02B 7/04; G02B 7/02; G02B 7/023; G02B 7/10;
(Continued)

(56) References Cited

U.S. PATENT DOCUMENTS 8,144,243 B2 3/2012 Kang
2004/0203268 A1 10/2004 Nishizawa
(Continued)

FOREIGN PATENT DOCUMENTS

CN 101536264 A 9/2009
CN 102036001 A 4/2011
(Continued)

OTHER PUBLICATIONS

International Search Report dated Mar. 12, 2019; International Application #: PCT/KR2018/015089.
(Continued)

*Primary Examiner* — Mahidere S Sahle
(74) *Attorney, Agent, or Firm* — Jefferson IP Law, LLP

(57) ABSTRACT

A camera module is provided. The camera includes a circuit board to which an image sensor disposed is disposed, one or more first conductive portions at one or more regions of the circuit board, one or more elastic connectors, including an elastic member and a metal film surrounding at least part of an outer portion of the elastic member, the elastic connector is disposed on the first conductive region, a lens device including one or more lenses and a driver capable of moving the lens device, a housing which accommodates the lens device, and a second conductive portion in one or more regions of the housing. The housing may be disposed above the elastic connector such that the second conductive portion is electrically coupled to the first conductive portion due to a contact with the elastic connector.

13 Claims, 23 Drawing Sheets

(51) Int. Cl.
*H05K 1/11* (2006.01)
*G03B 17/02* (2021.01)
*G02B 7/09* (2021.01)
*G02B 27/64* (2006.01)
*G03B 13/36* (2021.01)
*G03B 5/00* (2021.01)
*G02B 7/08* (2021.01)

(52) U.S. Cl.
CPC .................. *G02B 7/08* (2013.01); *G02B 7/09* (2013.01); *G02B 27/646* (2013.01); *G03B 5/00* (2013.01); *G03B 13/36* (2013.01); *G03B 2205/0007* (2013.01); *G03B 2217/002* (2013.01); *H05K 2201/0314* (2013.01); *H05K 2201/10121* (2013.01); *H05K 2201/10151* (2013.01)

(58) Field of Classification Search
CPC .......... G02B 7/102; G02B 7/105; G02B 7/28; G02B 13/001; G02B 26/128; G03B 3/10; G03B 5/00; G03B 13/36; G03B 13/32; G03B 2205/0069; G03B 2205/0007; G03B 2205/0046; G03B 2205/0053; G03B 2205/0061; H04N 5/2254; H04N 5/2253; H04N 5/2257; H04N 5/23287; H04N 5/23212; H05K 1/0274; H05K 1/189; H05K 1/118; H05K 1/18; H05K 1/181; H05K 2201/09027; H05K 2201/10151

USPC .................................. 359/676–706, 822–828
See application file for complete search history.

(56) References Cited

U.S. PATENT DOCUMENTS

| | | | |
|---|---|---|---|
| 2007/0298629 | A1 | 12/2007 | Ju |
| 2010/0091179 | A1 | 4/2010 | Murakami et al. |
| 2010/0265389 | A1 | 10/2010 | Mizumura |
| 2011/0080515 | A1 | 4/2011 | Kang |
| 2011/0261253 | A1 | 10/2011 | Chang |
| 2015/0281532 | A1* | 10/2015 | Yu ........................ H04N 5/2254 348/373 |

FOREIGN PATENT DOCUMENTS

| | | |
|---|---|---|
| CN | 102972018 A | 3/2013 |
| CN | 104954638 A | 9/2015 |
| CN | 105122130 A | 12/2015 |
| KR | 20-0414686 Y1 | 4/2006 |
| KR | 10-2010-0082627 A | 7/2010 |
| KR | 10-2015-0080815 A | 7/2015 |

OTHER PUBLICATIONS

Extended European Search Report dated Jun. 30, 2020, issued in European Patent Application No. 18898604.6.
Chinese Office Action dated Jun. 30, 2021, issued in Chinese Patent Application No. 201880085162.6.

* cited by examiner

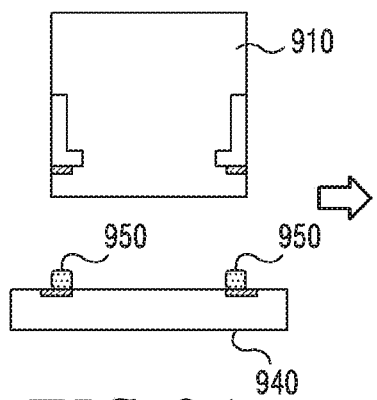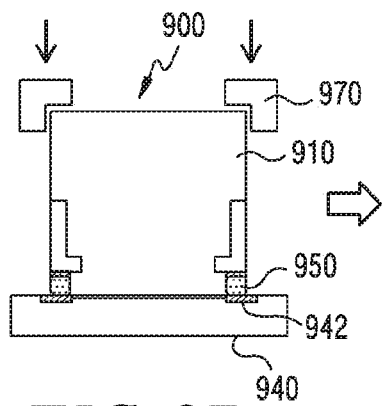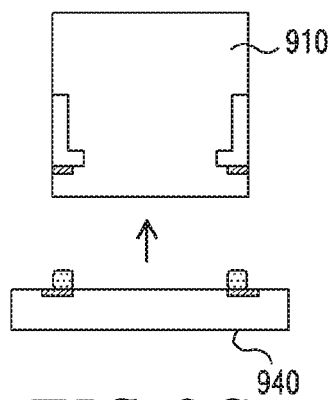
FIG.9A  FIG.9B  FIG.9C
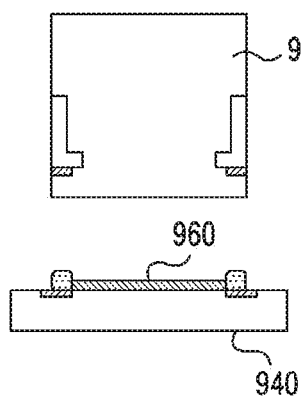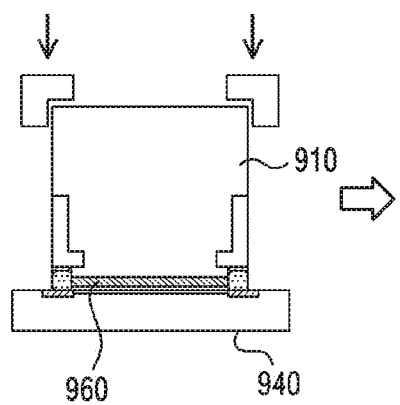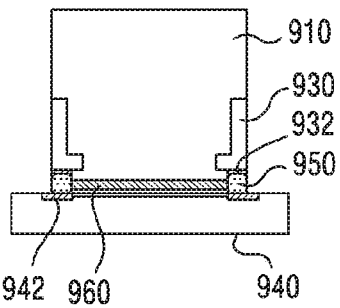
FIG.9D  FIG.9E  FIG.9F

CAMERA MODULE HAVING ELASTICITY AND MOBILE DEVICE WITH THE SAME

CROSS-REFERENCE TO RELATED APPLICATION(S)

This application is based on and claims priority under 35 U.S.C. § 119 of a Korean patent application number 10-2018-0000103, filed on Jan. 2, 2018, in the Korean Intellectual Property Office, the disclosure of which is incorporated by reference herein in its entirety.

BACKGROUND

1. Field

The disclosure relates to a camera module including a connector having elasticity and a moving device with the same.

2. Description of Related Art

A typical mobile device may have a camera disposed to a front side or a rear side or each of the front/rear side. When the camera is included in the mobile device, at least one or more module-type cameras may be mounted inside the mobile device.

The typical mobile module has a structure in which a housing including a lens group consisting of a plurality of lens arrays is fixed to a circuit board to which an image sensor is mounted.

In order to drive a lens such as auto-focus (AF)/optical image stabilizer (OIS) or the like, a circuit board located in a housing and a circuit board to which an image sensor is disposed are electrically coupled so that the AF/OIS or the like operates through power supplying, signal processing, or the like.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide a camera module including a connector having elasticity and a moving device with the same. However, if an image sensor failure or an actuator/lens failure occurs in a camera module, it is difficult to re-assemble and repair the camera module.

Another aspect of the disclosure is to provide a camera module which can be easily re-disassembled and repaired.

Another aspect of the disclosure is to provide a camera module with an improved throughput by decreasing the number of assembly processes.

Additional aspects will be set forth in part in the description which follows and, in part, will be apparent from the description, or may be learned by practice of the presented embodiments.

In accordance with an aspect of the disclosure, a camera module is provided. The camera module includes an image sensor, a circuit board to which the image sensor is disposed, one or more first conductive portions at one or more regions of the circuit board, one or more elastic connectors including an elastic member and a metal film surrounding at least part of an outer portion of the one or more elastic connectors, the one or more elastic connectors are disposed on the first conductive region, a lens device including one or more lenses and a driver for moving the lens device, a housing which accommodates the lens device, and a second conductive portion in one or more regions of the housing. The housing may be disposed above the elastic connector such that the second conductive portion is electrically coupled to the first conductive portion due to a contact with the elastic connector.

In accordance with another aspect of the disclosure, a camera module is provided. The camera module includes an image sensor, a first circuit board including the image sensor and at least one first connection pad disposed along a surrounding of the image sensor, a housing which includes an actuator provided with at least one lens and a second circuit board including at least one second connection pad, the actuator is fixed on the first circuit board by moving along an optical axis, and one or more elastic connectors disposed between the first circuit board and the second circuit board to electrically couple the second connection pad to the first connection pad.

In accordance with another aspect of the disclosure, a mobile device is provided. The mobile device includes a housing including a first side facing a first direction, and a second side facing a second direction opposite to the first direction, and at least one camera module mounted to at least one of the first side, the second side, or the first and second sides of the housing. The camera module may include a lens housing for housing a first circuit board including at least one first connection pad, a second circuit board including at least one second connection pad, an elastic member disposed between the first circuit board and the lens housing to electrically couple the second connection pad to the first connection pad, and one or more elastic connectors comprising a metal film surrounding at least part of an exterior of the elastic member.

Since a camera module according to various embodiments of the disclosure uses an elastic connector, the camera module can be easily disassembled and repaired, and an assembly process thereof can be improved.

If the camera module according to various embodiments of the disclosure is a dual camera module, the assembly process thereof can be easily accomplished.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which:

FIGS. 9A, 9B, 9C, 9D, 9E, and 9F sequentially illustrate a process of connecting a camera module to a circuit board by using an elastic connector according to various embodiments of the disclosure;

Throughout the drawings, it should be noted that like reference numbers are used to depict the same or similar elements, features, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

An electronic device according to various embodiments of the disclosure may include at least one of, for example, a smart phone, a tablet personal computer (PC), a mobile phone, a video phone, an e-book reader, a desktop PC, a laptop PC, a netbook computer, a workstation, a server, a personal digital assistant (PDA), a portable multimedia player (PMP), a MPEG-1 audio layer 3 (MP3) player, a mobile medical device, a camera, and a wearable device (e.g., smart glasses, a head-mounted display (HMD), electronic clothes, an electronic bracelet, an electronic necklace, an electronic appcessory, an electronic tattoo, a smart mirror, and a smart watch).

Figure 1:
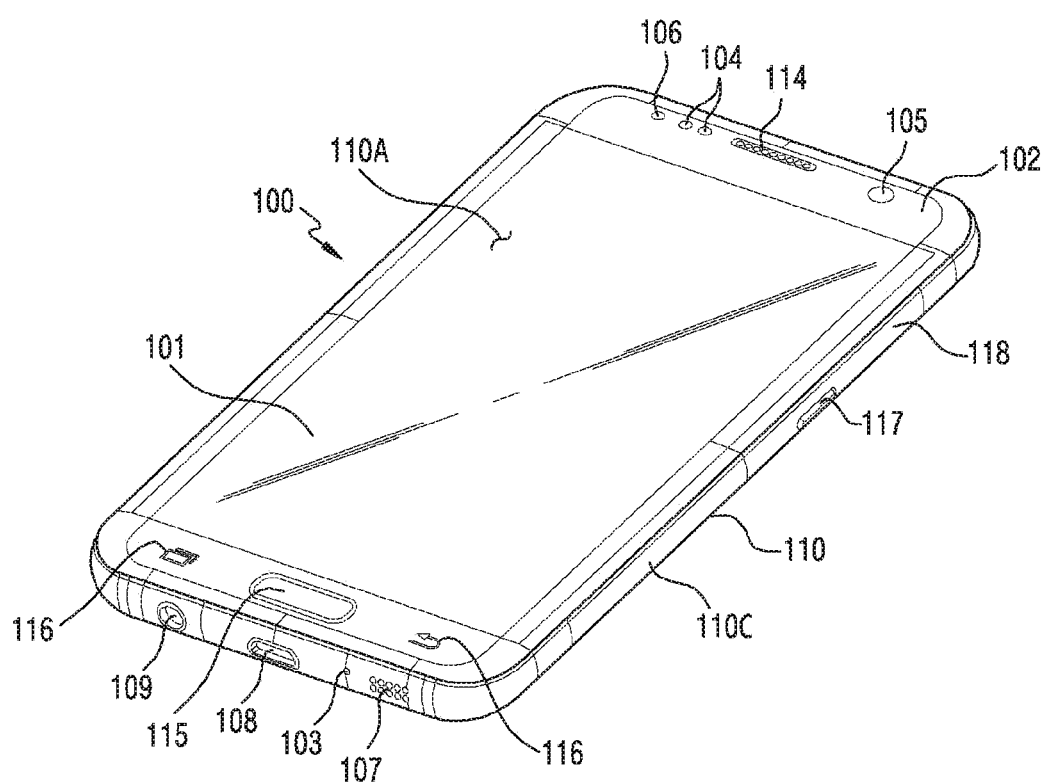
FIG. 1 is a front perspective view illustrating a mobile electronic device according to an embodiment of the disclosure.

FIG. 1 is a front perspective view illustrating a mobile electronic device according to an embodiment of the disclosure.

Figure 2:
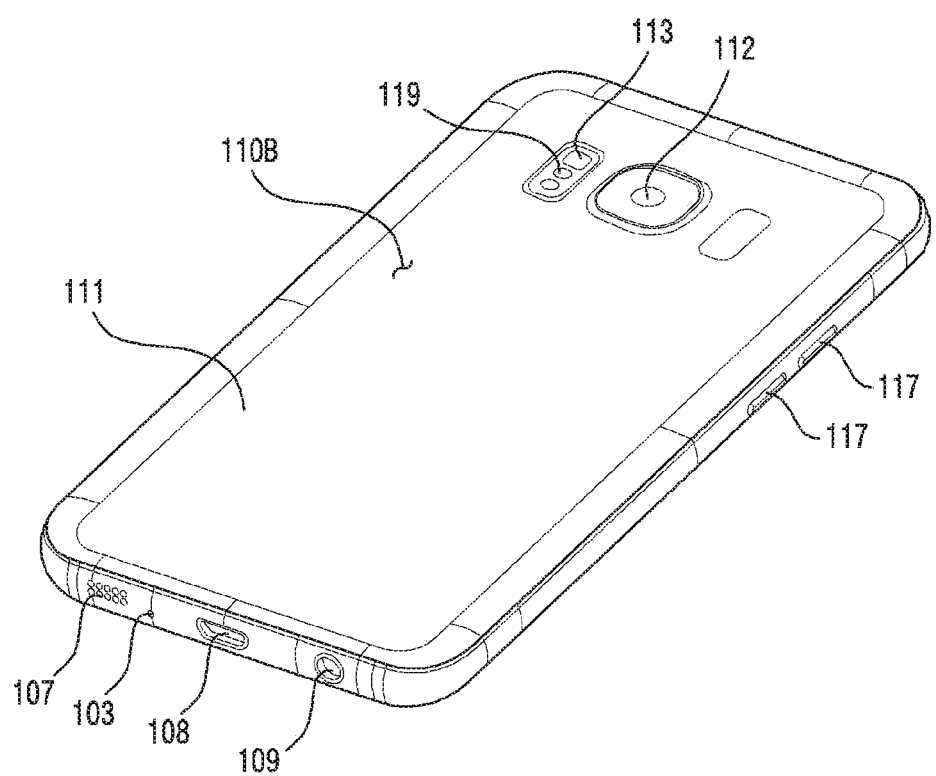
FIG. 2 is a rear perspective view illustrating a mobile electronic device according to an embodiment of the disclosure.

FIG. 2 is a rear perspective view illustrating a mobile electronic device according to an embodiment of the disclosure.

Referring to FIGS. 1 and 2, an electronic device 100 according to an embodiment may include a housing 110 including a first side (or a front side) 110A, a second side (or a rear side) 110B, and a lateral side 110C surrounding a space between the first side 110A and the second side 110B. In another embodiment (not shown), the housing may refer to a construction which constitutes part of the first side 110A, second side 110B, and third side 110C of FIG. 1. According to an embodiment, the first side 110A may be constructed of a front plate 102 (e.g., a polymer plate or a glass plate having various coating layers) which is at least partially transparent in practice. The second side 110B may be constructed of a rear plate 111 which is opaque in practice. For example, the rear plate 111 may be constructed of coated or colored glass, ceramic, polymer, metallic materials (e.g. aluminum, stainless steel (STS), or magnesium) or a combination of at least two of the materials. The lateral side 110C may be constructed of a lateral bezel construction (or a lateral member) 118 bonded to the front plate 102 and the rear plate 111 and including metal and/or polymer. In some embodiments, the rear plate 111 and the lateral bezel construction 118 may be constructed integrally and may include the same material (e.g., a metallic material such as aluminum).

According to an embodiment, the electronic device 100 may include at least one or more of a display 101, audio modules 103, 107, and 114, sensor modules 104, and 119, camera modules 105, 112, and 113, and key input devices 116 and 117, an indicator 106, and connector holes 108 and 109. In some embodiments, the electronic device 100 may omit at least one (e.g., the key input devices 116 and 117 or the indicator 106) of these components, or may additionally include other components.

The display 101 may be exposed through, for example, some portions of the front plate 102. The display 101 may be disposed adjacent to or bonded to a touch sensing circuit, a pressure sensor capable of measuring touch strength (pressure), and/or a digitizer for detecting a stylus pen of a magnetic field type.

The audio modules 103, 107, and 114 may include the microphone hole 103 and the speaker holes 107 and 114. The microphone hole 103 may have a microphone disposed inside thereof to acquire external sound, and in some embodiments, may have a plurality of microphones disposed to sense a sound direction. The speaker holes 107 and 114 may include the external speaker hole or holes 107 and the communication receiver hole 114. In some embodiments, the speaker holes 107 and 114 and the microphone hole 103 may be implemented with one hole, or the speaker may be included without the speaker holes 107 and 114 (e.g., a Piezo speaker).

The sensor modules 104 and 119 may generate an electrical signal or data value corresponding to an internal operating state of the electronic device 100 or an external environmental state. The sensor modules 104 and 119 may include, for example, the first sensor module 104 (e.g., a proximity sensor) and/or second sensor module (not shown) (e.g., a fingerprint sensor) disposed to the first side 110A of the housing 110, and/or the third sensor module 119 (e.g., a heart rate monitor (HRM) sensor) disposed to the second side 110B of the housing 110. The fingerprint sensor may be disposed not only to the first side 110A (e.g., a home key button 115) of the housing 110 but also to the second side 110B. The electronic device 100 may further include at least one of a sensor module (not shown), for example, a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, and an illumination sensor 104.

The camera modules 105, 112, and 113 may include the first camera device 105 disposed to the first side 110A of the electronic device 100, the second camera device 112 disposed to the second side 110B, and/or the flash 113. The camera module 105 and 112 may include one or more lenses, an image sensor, and/or an image signal processor. The flash 113 may include, for example, a light emitting diode (LED) or a xenon lamp. In some embodiments, two or more lenses (wide angle and telephoto lenses) and image sensors may be disposed to one side of the electronic device 100.

The key input devices 115, 116, and 117 may include the home key button 115 disposed to the first side 110A of the housing 110, a touch pad in the form of the touch pad 116 disposed around the home key button 115, and/or the side key button 117 disposed to the lateral side 110C of the housing 110. In another embodiment, the electronic device 100 may not include some or all of the aforementioned key input devices 115, 116, and 117. The key input devices 115, 116, and 117, which are not included, may be implemented on the display 101 in a different form such as a soft key or the like.

The indicator 106 may be disposed to, for example, the first side 110A of the housing 110. The indicator 106 may provide, for example, state information of the electronic device 100 in an optical form, and may include an LED.

The connector holes 108 and 109 may include the first connector hole 108 capable of accommodating a connector (e.g., a universal serial bus (USB) connector) for transmitting/receiving power and/or data of an external electronic device and/or the second connector hole (e.g., earphone jack) 109 capable of accommodating a connector for transmitting/receiving an audio signal with respect to the external electronic device.

Figure 3:
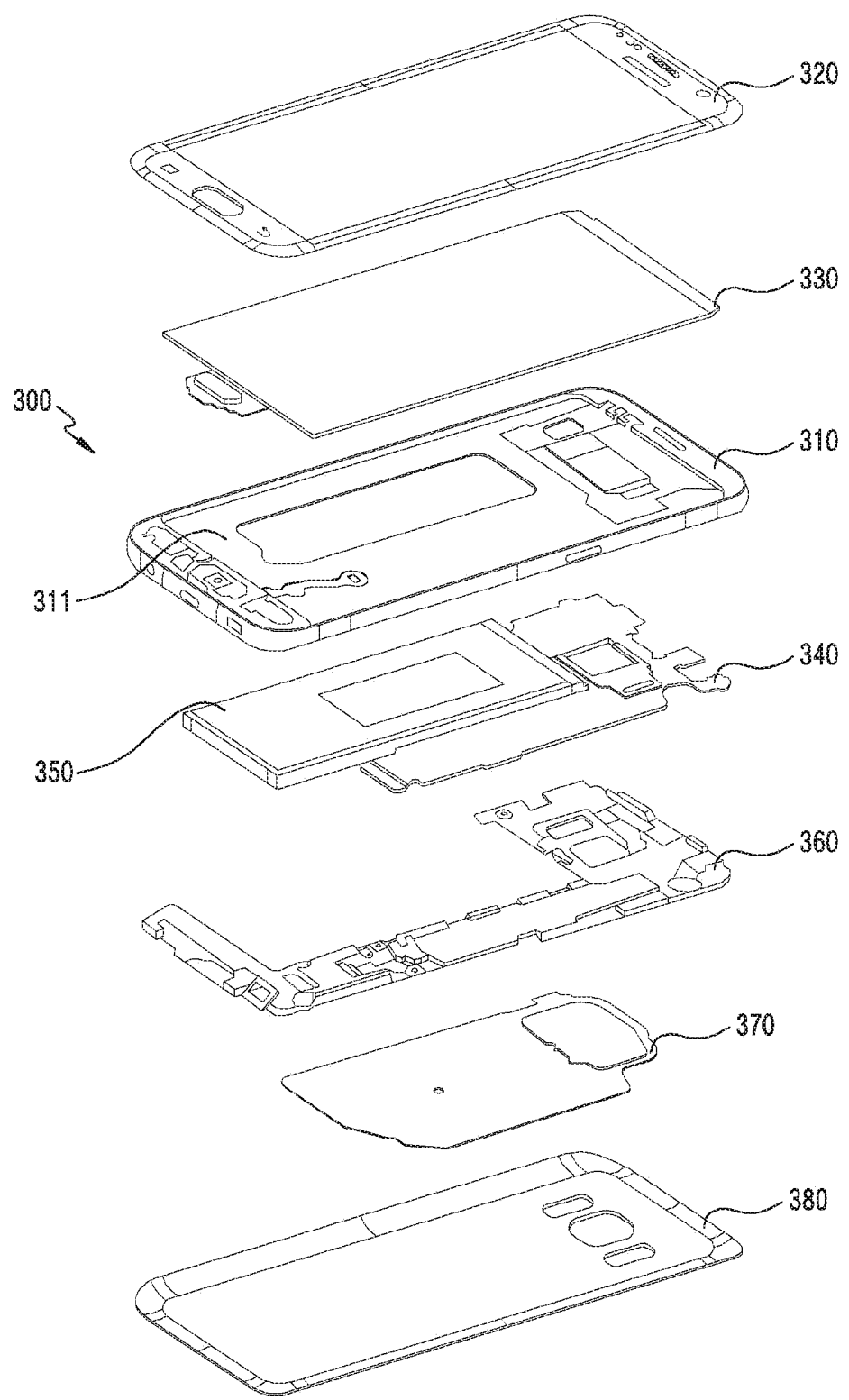
FIG. 3 is an exploded perspective view illustrating an inner structure of a mobile electronic device according to an embodiment of the disclosure.

FIG. 3 is an exploded perspective view illustrating an inner structure of a mobile electronic device according to an embodiment of the disclosure.

Referring to FIG. 3, an electronic device 300 may include a lateral bezel construction 310, a first support member 311 (e.g., a bracket), a front plate 320, a display 330, a printed circuit board 340, a battery 350, a second support member 360 (e.g., a rear case), an antenna 370, and a rear plate 380. In some embodiments, the electronic device 300 may omit at least one (e.g., the first support member 311) of these components, or may additionally include other components. At least one of the components of the electronic device 300 may be the same as or similar to at least one of the components of the electronic device 100 of FIG. 1 or FIG. 2, and redundant descriptions will be omitted hereinafter.

The first support member 311 may be coupled with the lateral bezel construction 310 by being disposed inside the electronic device 300, or may be constructed integrally with respect to the lateral bezel construction 310. The first support member 311 may be constructed of, for example, a metal material and/or non-metal material (e.g., polymer). The display 330 may be coupled to one side of the first support member 311, and the printed circuit board 340 may be coupled to the other side thereof. A processor, a memory, and/or an interface may be mounted on the printed circuit board 340. The processor may include, for example, one or more of a central processing unit, an application processor, a graphic processing unit, an image signal processor, a sensor hub processor, and a communication processor.

The memory may include, for example, a volatile memory or a non-volatile memory.

The interface may include, for example, a high definition multimedia interface (HDMI), a USB interface, a secure digital (SD) card interface, and/or an audio interface. For example, the interface may electrically or physically couple the electronic device 300 and the external electronic device, and may include a USB connector, an SD card/multi-media card (MMC) connector, or an audio connector.

As a device for supplying power to at least one component of the electronic device 300, the battery 350 may include, for example, a non-rechargeable primary cell, a rechargeable secondary cell, or a fuel cell. At least one portion of the battery 350 may be disposed on the same plane substantially with respect to, for example, the printed circuit board 340. The battery 350 may be disposed integrally inside the electronic device 100, or may be detachably disposed with respect to the electronic device 300.

The antenna 370 may be disposed between the rear plate 380 and the battery 350. The antenna 370 may include, for example, a near field communication (NFC) antenna, a wireless charging antenna, and/or a magnetic secure transmission (MST) antenna. The antenna 370 may perform short-range communication, for example, with the external electronic device, or may wirelessly transmit/receive power required for charging. In another embodiment, an antenna construction may be constructed by at least part of the lateral bezel construction 310 and/or the first support member 311 or a combination thereof.

Figure 4:
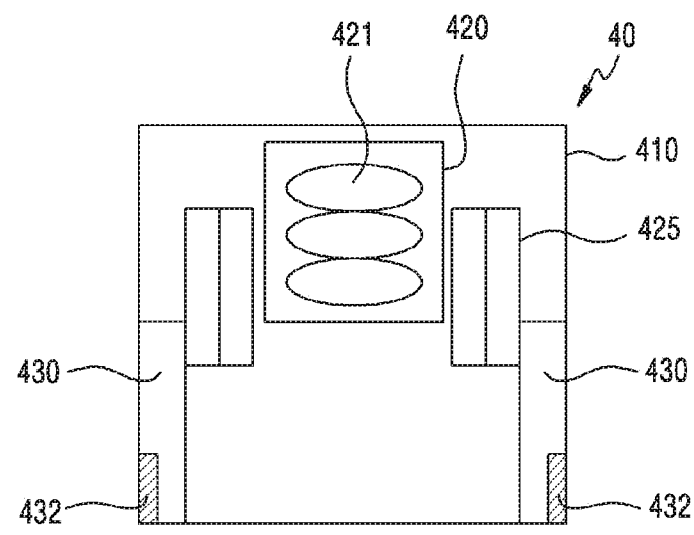
FIG. 4 is a cross-sectional view illustrating a state before a camera module is coupled to a circuit board according to an embodiment of the disclosure.
Figure 4:
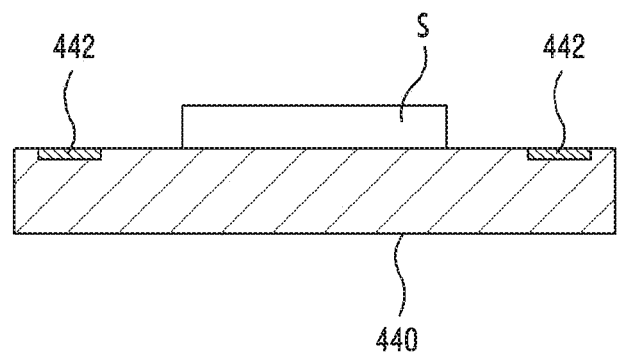

FIG. 4 is a cross-sectional view illustrating a state before a camera module is coupled to a circuit board according to an embodiment of the disclosure.

Figure 5:
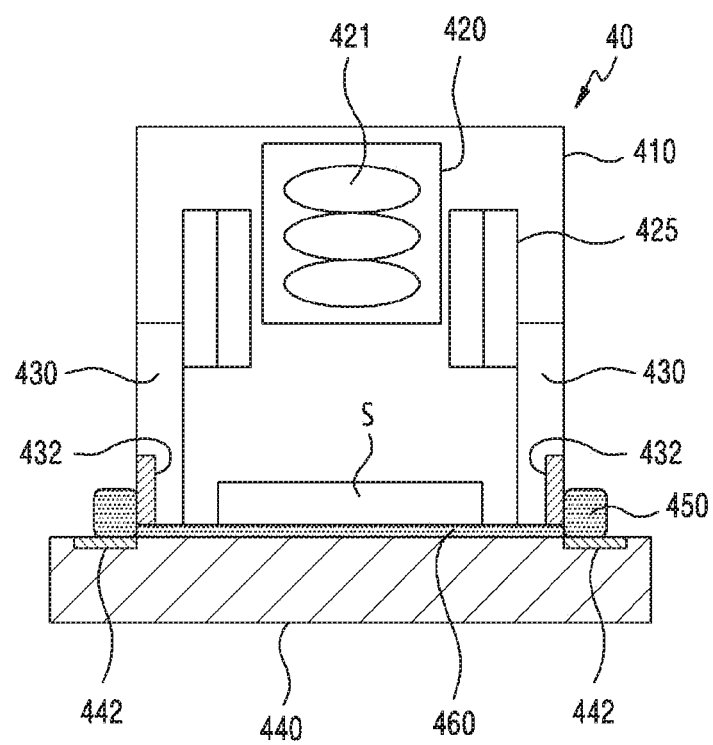
FIG. 5 is a cross-sectional view illustrating a state where a camera module is coupled to a circuit board according to an embodiment of the disclosure.

FIG. 5 is a cross-sectional view illustrating a state where a camera module is coupled to a circuit board according to an embodiment of the disclosure.

Referring to FIG. 4 and FIG. 5, a camera module 40 according to the embodiment is disposed to a front side or a rear side or a front/rear side of a mobile device, and may include a first circuit board 440 to which an image sensor s is mounted and a housing 410 which is provided with an actuator 420 and a second circuit board 430. The actuator 420 is provided with a lens group (lens unit) consisting of an array of a plurality of lenses 421.

In order for the camera module 40 according to various embodiments to drive the lens 421 such as an auto focus (AF)/optical image stabilizer (OIS) or the like, the first and second circuit boards 430 and 440 are electrically coupled to perform an operation such as AF/OIS or the like through power supplying, signal processing, or the like.

In order to couple the first circuit board 440 and the second circuit board 430, the first and second conductive portions 442 and 432, for example, first and second connection pads, may be created respectively on the first and second circuit boards 440 and 430, and the first and second connection pads may be coupled by means of soldering or a conductive epoxy. In this manner, the housing 410 may be electrically coupled and fixed to the first circuit board 440. A guide for moving the actuator 420 up and down along an optical axis is indicated by a reference numeral 425. For example, the guide 425 may consist of a plurality of ball bearings.

In a process of manufacturing the camera module 40, an image sensor s and the lens 421 are simultaneously driven to perform a proper examination. In order for the lens 421 to operate a function such as AF/OIS or the like, power and signals from the first circuit board 440 need to be transferred to the second circuit board 430.

For this, the housing 410 may be mounted on the first circuit board 440 by using an epoxy resin 460 and thereafter the first and second conductive portions 442 and 432 of the first and second circuit boards 440 and 430 may be coupled by using soldering and a conductive epoxy 450. Subsequently, after the first and second circuit boards 440 and 430 are electrically coupled, the camera module 40 may be subjected to the proper examination by driving the actuator 420 and thus may determine whether the camera module is defective or not.

However, if an image sensor failure or an actuator/lens failure occurs during a process of assembling the camera module, it may be difficult to repair and reassembly the actuator and the first circuit board fixed with epoxy or fixed with soldering/conductive epoxy.

Hereinafter, a structure and assembly process of a camera module according to various embodiments of the disclosure will be described with reference to the accompanying drawings.

Figure 6:
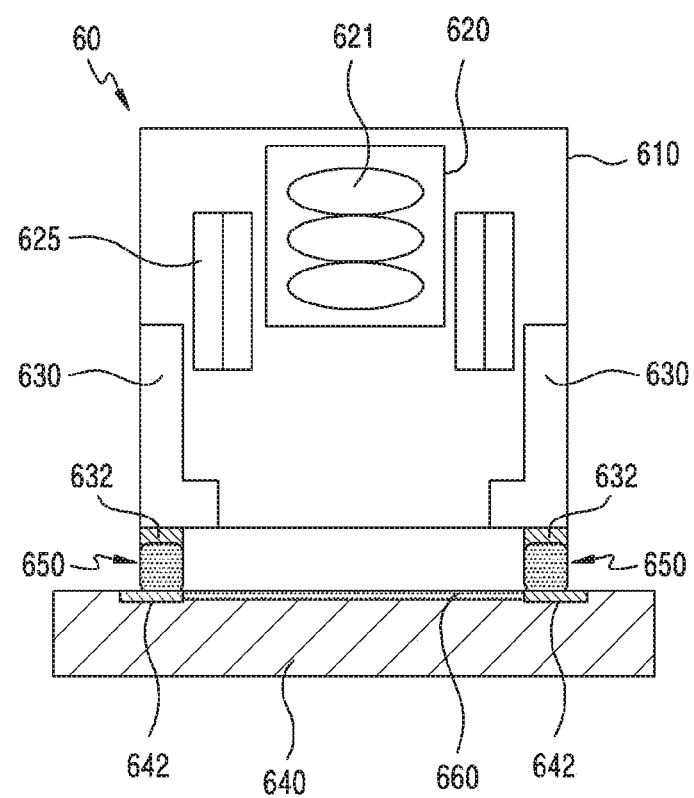
FIG. 6 is a cross-sectional view illustrating a state where a camera module is connected to a circuit board according to an embodiment of the disclosure.

FIG. 6 is a cross-sectional view illustrating a state where a camera module is connected to a circuit board according to an embodiment of the disclosure.

Figure 7:
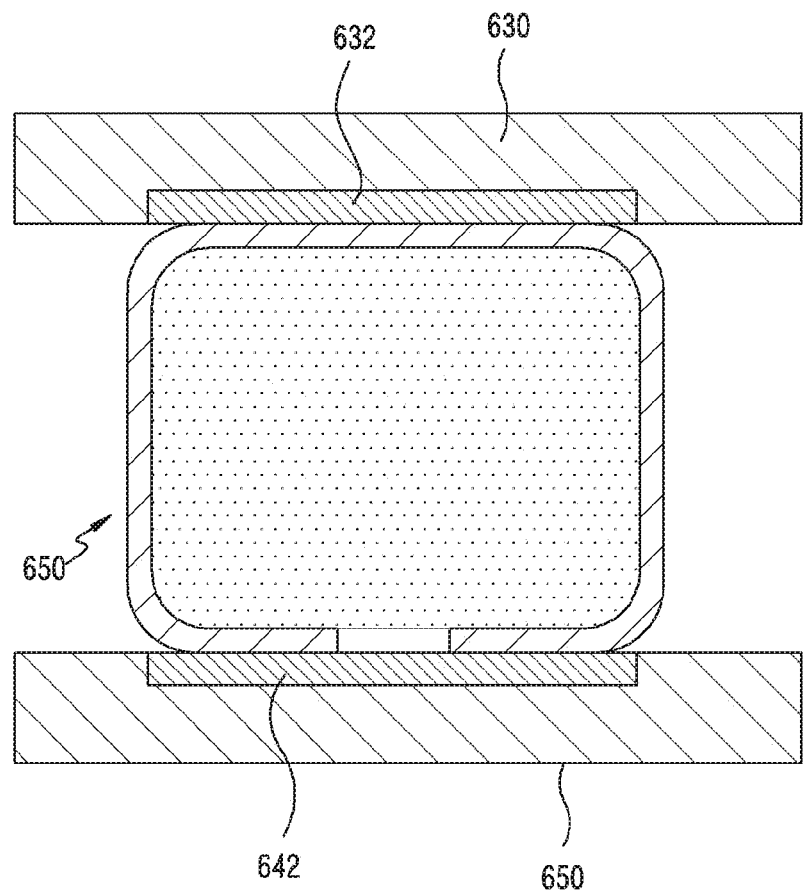
FIG. 7 is an enlarged view illustrating main part of FIG. 6 according to an embodiment of the disclosure.

FIG. 7 is an enlarged view illustrating main part of FIG. 6 according to an embodiment of the disclosure.

Referring to FIG. 6 and FIG. 7, at least one camera module may be mounted to a front side (e.g., 105 of FIG. 1) or a rear ide (112 of FIG. 2) or front and rear sides of a mobile device according to various embodiments. For example, the camera module may include a single camera module or a dual camera module. When the camera module is mounted to the front side of the mobile device, it may be called a front camera module, and when the camera module is mounted to the rear side of the device, it may be called a rear camera module.

A camera module 60 according to various embodiments may be provided with a first circuit board 640 to which the image sensor s is mounted and a housing 610 provided with an actuator 620 and a second circuit board 630. The actuator 620 is provided with a lens group consisting of a plurality of lenses 421. The actuator 620 moves along an optical axis in the housing 610 to focus a subject. The movement of the actuator 620 may use force of a driving unit including a voice coil motor (VCM) which uses electromagnetic force. In terms of an external shape, the housing 610 is constructed in a rectangular parallelepiped shape, and the actuator 620 is constructed in a cylindrical shape to move along the optical axis in the housing 610.

For example, each of the first and second circuit boards may be constructed of a rigid material or a flexible material.

In order for the camera module 60 according to various embodiments to drive a lens 621 such as an AF/OIS or the like, the first and second circuit boards 630 and 640 are electrically coupled to perform an operation such as AF/OIS or the like through power supplying, signal processing, or the like.

The camera module 60 according to various embodiments may use at least one elastic connector 650 to couple the first circuit board 640 and the second circuit board 630. First and second conductive portions 642 and 632, for example, first and second connection pads, are created respectively in the first and second circuit boards 640 and 630, and each of the first and second connection pads may be electrically coupled by using the elastic connector 650.

The elastic connector 650 according to various embodiments may be used as a connection terminal, as a conductive member having elasticity. At least one elastic connector 650 may be mounted to the first circuit board 640 by using a surface mounting technology (SMT).

For example, if four connection pads are disposed to the first circuit board 640 and four connection pads are disposed to the second circuit board 630, each of the conductive portions is electrically coupled by using the four elastic connectors 650, and thus the first and second circuit boards 640 and 630 may be elastically coupled. One side of the elastic connector may be connected with the first conductive portion, and the other side may be connected with the second conductive portion.

A guide for moving the actuator 620 up and down along an optical axis is indicated by a reference numeral 625. For example, the guide 625 may consist of a plurality of ball bearings.

The camera module may be fixed to the first circuit board 640 by using, for example, an epoxy resin 660.

FIGS. 8A through 8G are cross-sectional views illustrating respective elastic connectors according to various embodiments of the disclosure. Structures of the respective elastic connectors according to various embodiments will be described with reference to FIG. 8A to FIG. 8G.

Figure 8A:
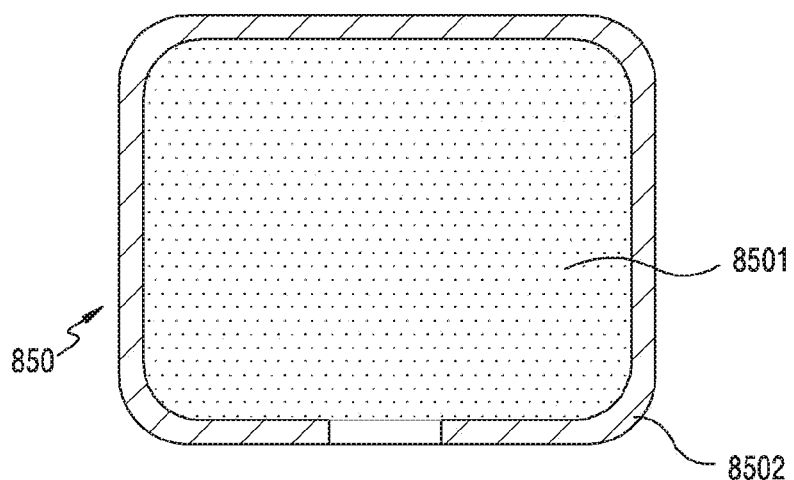
FIGS. 8A, 8B, 8C, 8D, 8E, 8F, and 8G are cross-sectional views illustrating respective elastic connectors according to various embodiments of the disclosure.

Referring to FIG. 8A, an elastic connector 850 according to various embodiments may correspond to another embodiment of the elastic connector 650 of FIG. 6 and FIG. 7. The elastic connector 850 according to various embodiments may include an elastic member 8501 and a metal film 8502. As an outer cover of the elastic member 8501, the metal film 8502 may be constructed to surround at least part of an outer portion. The elastic connector 850 may change its shape when pressure is applied externally, and may return to its original state when the applied external pressure is removed.

For example, the elastic member 8501 may include silicon or sponge, and the metal film 8502 may include a copper foil or the like. A first portion of the metal film 8502 is conducted to a first connection pad (e.g., 642 of FIG. 6 and FIG. 7), and a second portion opposed to the first portion may be conducted to a second connection pad (e.g., 632 of FIG. 6 and FIG. 7).

The elastic member 850 according to various embodiments may be constructed in various shapes, for example, a roughly cuboidal shape, cubic shape, or the like.

Figure 8B:
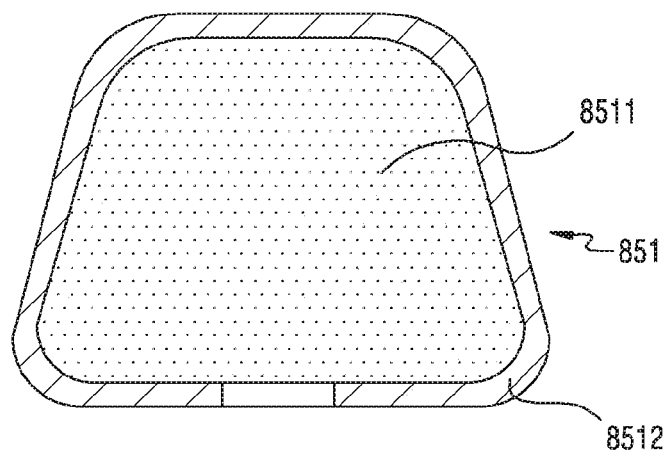

Referring to FIG. 8B, an elastic connector 851 according to various embodiments may correspond to another embodiment of the elastic connector 650 of FIG. 6 and FIG. 7. The elastic connector 851 according to various embodiments may include an elastic member 8511 and a metal film 8512. As an outer cover of the elastic member 8511, the metal film 8512 may be constructed to surround at least part of an outer portion.

For example, the elastic member 8511 may include silicon or sponge, and the metal film 8502 may include a copper foil or the like. The elastic members 851 according to various embodiments may be constructed in various shapes, for example, a hexahedral shape of which a cross section has a roughly isosceles trapezoidal shape.

Figure 8C:
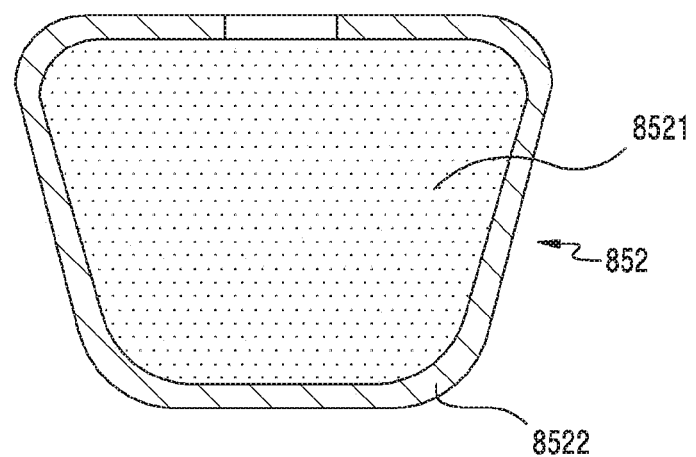

Referring to FIG. 8C, an elastic connector 852 according to various embodiments may correspond to another embodiment of the elastic connector 650 of FIG. 6 and FIG. 7. The elastic connector 852 according to various embodiments may include an elastic member 8521 and a metal film 8522. As an outer cover of the elastic member 8521, the metal film 8522 may be constructed to surround at least part of an outer portion.

For example, the elastic member 8521 may include silicon or sponge, and the metal film 8522 may include a copper foil or the like. The elastic members 852 according to various embodiments may be constructed in various shapes, for example, a hexahedron of which a cross section has a roughly inverted isosceles trapezoidal shape.

Figure 8D:
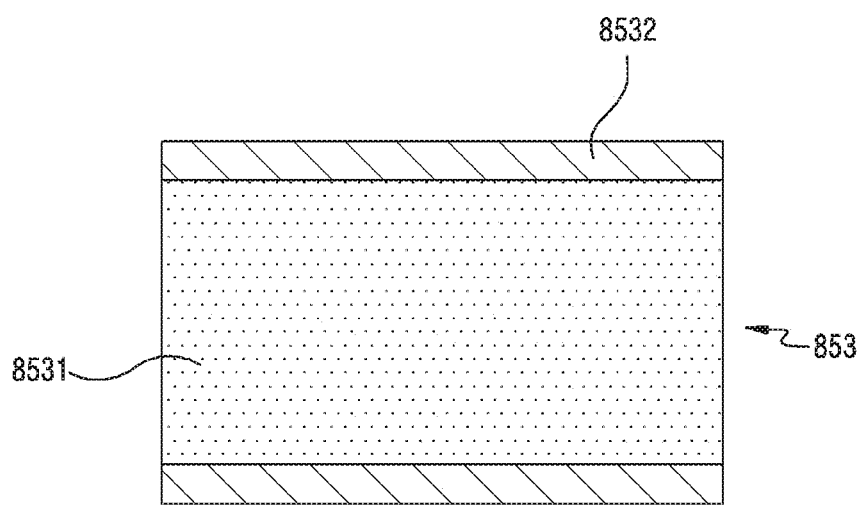

Referring to FIG. 8D, an elastic connector 853 according to various embodiments may correspond to another embodiment of the elastic connector 650 of FIG. 6 and FIG. 7. The elastic connector 853 according to various embodiments may include an elastic member 8531 and a metal film 8532. As an outer cover of the elastic member 8531, the metal film 8532 may be constructed to surround at least part of an outer portion.

For example, the elastic member 853 may include a silicon material or a sponge material, and the metal film 8532 may include a copper foil or the like. The elastic member(s) 853 according to various embodiments may be constructed in a cylindrical shape.

Figure 8E:
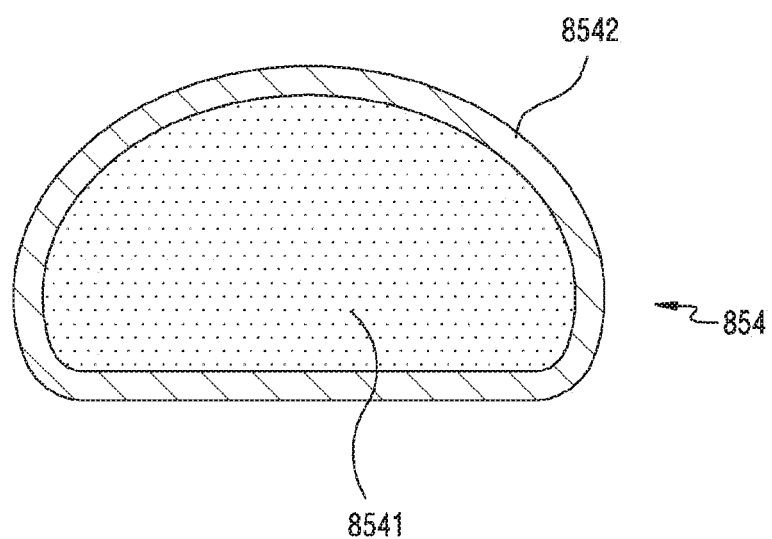

Referring to FIG. 8E, an elastic connector 854 according to various embodiments may correspond to another embodiment of the elastic connector 650 of FIG. 6 and FIG. 7. The elastic connector 854 according to various embodiments may include an elastic member 8541 and a metal film 8542. As an outer cover of the elastic member 8541, the metal film 8542 may be constructed to surround at least part of an outer portion.

For example, the elastic member 8541 may include silicon or sponge, and the metal film 8542 may include a copper foil or the like. The elastic member(s) 854 according to various embodiments may be constructed in semi-cylindrical or hemispheric shapes.

Figure 8F:
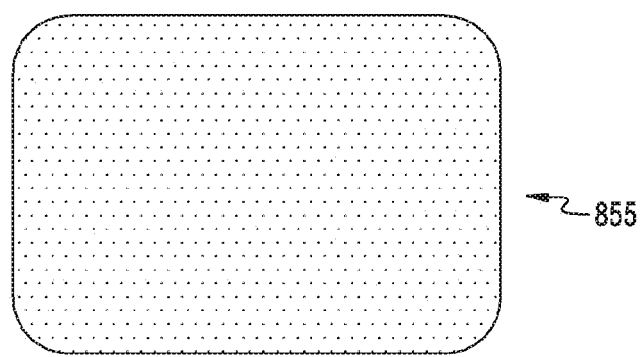

Referring to FIG. 8F, an elastic connector 855 according to various embodiments may correspond to another embodiment of the elastic connector 650 of FIG. 6 and FIG. 7. The elastic connector 855 according to various embodiments may be constructed of a conductive elastic body.

For example, the conductive elastic body may be constructed in various shapes, for example, a cuboidal shape, a cubic shape, a hexahedral shape, of which a cross section has a roughly isosceles trapezoidal shape, a cylindrical shape, a semi-cylindrical shape, a spherical shape, a hemispheric shape, or the like.

Figure 8G:
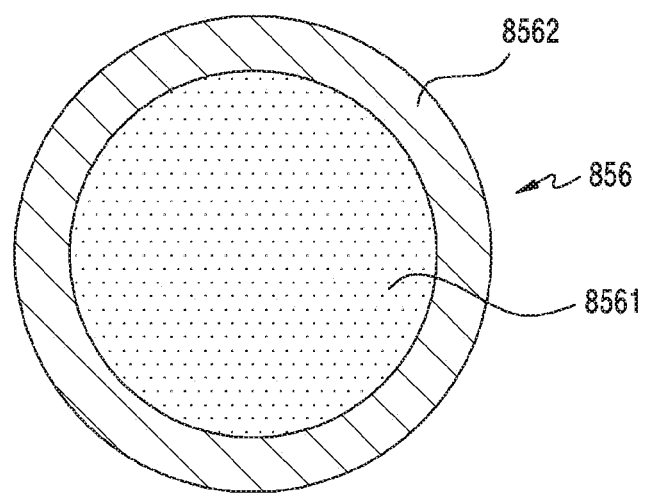

Referring to FIG. 8G, an elastic connector 856 according to various embodiments may correspond to another embodiment of the elastic connector 650 of FIG. 6 and FIG. 7. The elastic connector 856 according to various embodiments may include an elastic member 8561 and a metal film 8562. As an outer cover of the elastic member 8561, the metal film 8562 may be constructed to surround at least part of an outer portion.

For example, the elastic member 8561 may include silicon or sponge, and the metal film 8562 may include a copper foil or the like. The elastic members 856 according to various embodiments may be constructed in a spherical shape.

FIGS. 9A through 9F sequentially illustrates a process of connecting a camera module to a circuit board by using an elastic connector according to various embodiments of the disclosure.

Referring to FIGS. 9A through 9F, an assembly process of a camera module will be described according to various embodiments of the disclosure.

FIG. 9A illustrates a state where an elastic connector 950 (e.g., the elastic connector 650) is mounted to a first circuit board 940 (e.g., the first circuit board 640) by using a surface mount device (SMD). This is a state before a housing 910 (e.g., the housing 610) is fixed to the first circuit board 940.

FIG. 9B illustrates a simple assembly state where the housing 910 is lowered along an optical axis by means of an alignment device 970 and thus is coupled with the elastic connector 950. A camera module 900 may be subjected to a proper examination in this state.

FIG. 9C illustrates a state where the housing 910 is detached from the first circuit board 940 by examining the camera module and making a selection after determining whether it is defective or not.

FIG. 9D illustrates a state where an epoxy resin 960 is coated on the first circuit board 940 along a surrounding of a sensor in order to fix the housing 910 to the first circuit board 940.

FIG. 9E illustrates a state where the housing 910 is lowered again (reassembled) along the optical axis by using the alignment device 970 and thus a lower end of the housing 910 is fixed by being adhered to the epoxy resin 960 (e.g., the epoxy resin 660). The epoxy region 960 may be hardened to fix the housing 910 and the first circuit board 940.

FIG. 9F illustrates a state where the housing 910 is disposed (fixed and coupled) on the first circuit board 940 after completely examining the camera module. Each connection pad 942 (e.g., the connection pad 642) of the first circuit board 940 may be in a state of being electrically coupled to a connection pad 932 (e.g., the connection pad 632) of a second circuit board 930 provided in the housing 910, by means of each elastic connector 950.

FIGS. 10A through 10F sequentially illustrate a process of coupling a cameral module to a circuit board by using an elastic connector according to various embodiments of the disclosure. A process of assembling the camera module according to various embodiments of the disclosure will be described with reference to FIGS. 10A through 10F.

Figure 10A:
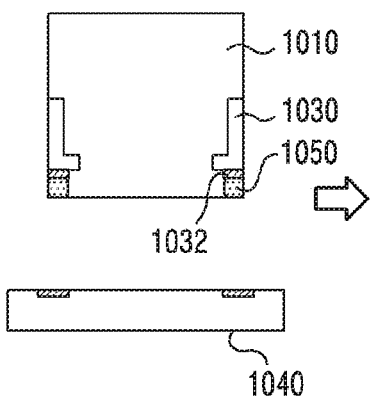
FIGS. 10A, 10B, 10C, 10D, 10E, and 10F sequentially illustrate a process of coupling a camera module to a circuit board by using an elastic connector according to various other embodiments of the disclosure.

FIG. 10A illustrates a state where an elastic connector 1050 (e.g., the elastic connector 650) is mounted to a second connection pad 1032 of a second circuit board 1030 (e.g., the second circuit board 630) provided in a housing 1010 (e.g., the housing 610) by using a surface mount device (SMD). This is a state before the housing 1010 is fixed to a first circuit board 1040 (e.g., the first circuit board 640).

Figure 10B:
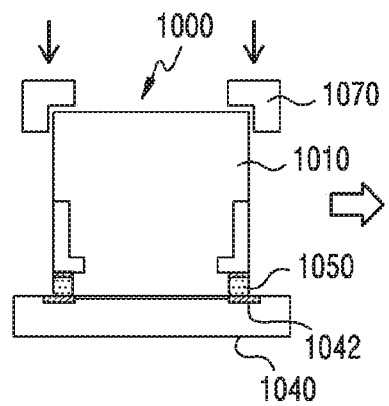

FIG. 10B illustrates a simple assembly state where the housing 1010 is lowered along an optical axis by means of an alignment device 1070 and thus is coupled with a first connection pad 1042 (e.g., the first connection pad 642) of the first circuit board 1040. The camera module 1000 may be subjected to a proper examination in this state.

Figure 10C:
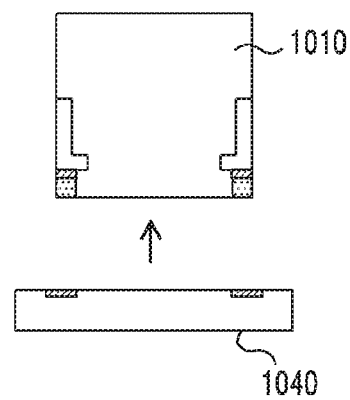

FIG. 10C illustrates a state where the housing 1010 is detached from the first circuit board 1040 by examining the camera module and making a selection after determining whether it is defective or not.

Figure 10D:
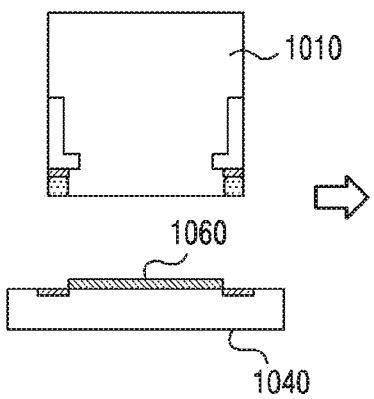

FIG. 10D illustrates a state where an epoxy resin 1060 is coated on the first circuit board 1040 along a surrounding of a sensor in order to fix the housing 1010 to the first circuit board 1040.

Figure 10E:
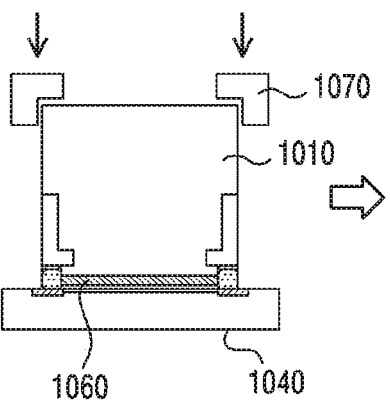

FIG. 10E illustrates a state where the housing 1010 is lowered again (reassembled) along the optical axis by using the alignment device 1070 and thus a lower end of the housing 1010 is fixed by being adhered to the epoxy resin 1060. The epoxy region 1060 may be hardened to fix the housing 1010 and the first circuit board 1040.

Figure 10F:
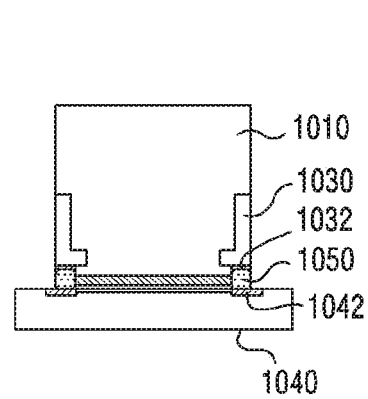

FIG. 10F illustrates a state where the housing 1010 is disposed (fixed and coupled) on the first circuit board 1040 after completely examining the camera module. Each first connection pad 1042 of the first circuit board 1040 may be in a state of being electrically coupled to the second connection pad 1032 (e.g., the connection pad 632) of the second circuit board 1030 provided in the housing 1010, by means of each elastic connector 1050.

Figure 11:
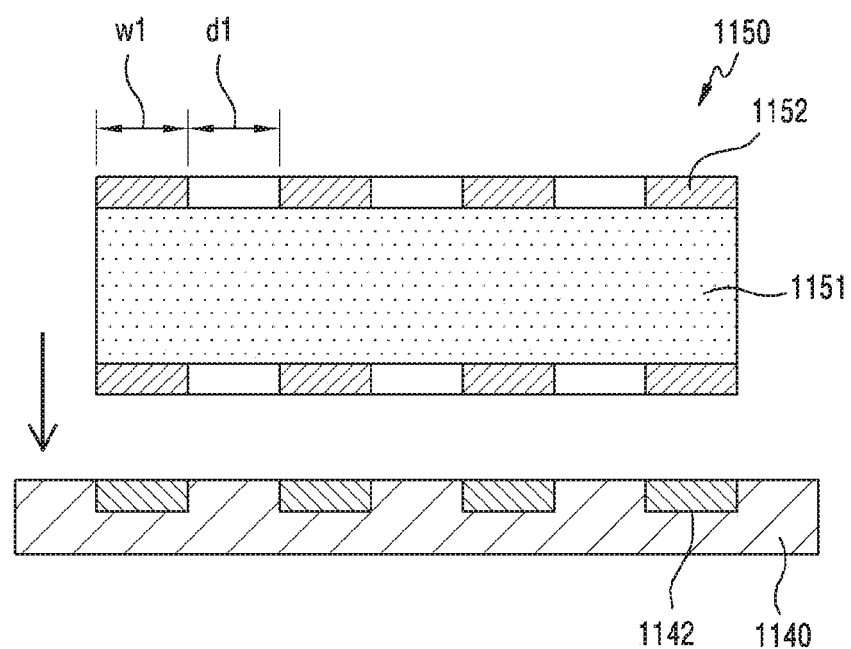
FIG. 11 is a cross-sectional view illustrating a state before an integral-type elastic connector is coupled to a circuit board according to an embodiment of the disclosure.

FIG. 11 is a cross-sectional view illustrating a state before an integral-type elastic connector is coupled to a circuit board according to an embodiment of the disclosure.

Referring to FIG. 11, an elastic connector 1150 according to various embodiments may be another embodiment of the elastic connector 650 of FIG. 6 and FIG. 7.

In the elastic connector 1150 (e.g., the elastic connector 650) according to various embodiments, a plurality of connector portions 1152 which are in contact with respective connection pads 1142 (e.g., the connection pad 642) mounted to a first circuit board 1140 (e.g., the first circuit board 640) may be constructed in an integral type by means of an elastic member 1151. The number of connection pads to be required may be 4, 8, 12, or more according to performance upgrade of the camera module. Each of the connector portions 1152 may be equidistantly separated, and may be insulated by means of at least part of the elastic member 1151. For example, the connector portion 1152 may consist of a copper foil or the like.

For example, when four connection pads are disposed to a housing of the camera module and four connection pads 1142 are disposed to the first circuit board 1140, the elastic connector 1150 may be constructed of four connector portions 1152 and thus may be mounted to the first circuit board 1140 at a time by using an SMD.

The elastic connector 1150 having the four connector portions 1152 can be mounted to the connection pad or pads 1142 of the first circuit board at a time instead of mounting a single elastic connector to each of the connection pads 1142 of the first circuit boards 1140, thereby facilitating to reduce the number of processes.

The elastic connector 1150 according to various embodiments may be constructed in a roughly cuboidal, cylindrical, or semi-cylindrical shape.

The elastic connector 1150 according to various embodiments may be constructed such that a width w1 of each of the connector portions 1152 and a distance d1 between the connector portions 1152 is adjustable. For example, since more connector portions can be constructed by narrowing the width w1 of each of the connector portions 1152 and the distance d1 between the connector portion 1152, it is possible to cope with an increase in the number of connection pads to be mounted due to the performance upgrade of the camera module in a limited mounting space of a mobile device.

The smaller the width w1 and the distance d1 of the connector portion 1152 of the elastic connector 1150, the more the contact points between the connector portion 1152 and the connection pad or pads 1142. As a result, the elastic connector 1150 can be improved in terms of a freedom of design.

FIGS. 12A through 12E are plan views illustrating various respective circuit boards to which an elastic connector is connected according to various embodiments of the disclosure.

FIGS. 12A through 12E are plan views briefly illustrating a state of deploying a connection pad mounted to a first circuit board according to various embodiments. A connection pad of a second circuit board provided in a housing (not shown) may also be disposed to a position corresponding to the connection pad. However, for convenience of explanation, the connection pad disposed to the first circuit board will be described as an example.

Figure 12A:
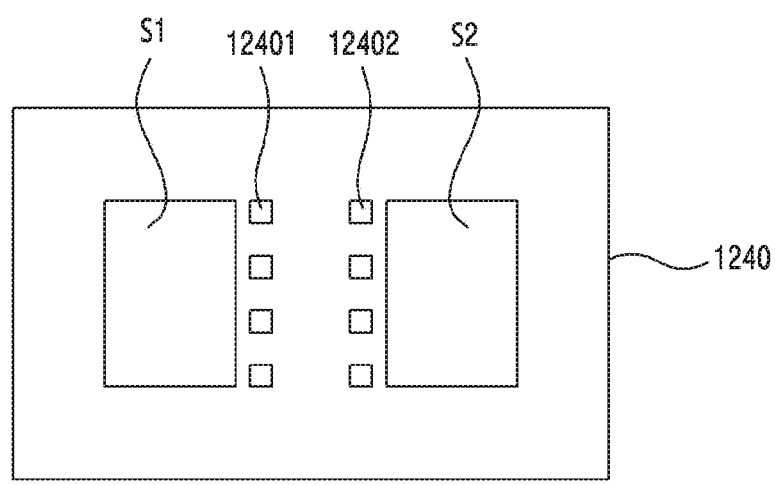
FIGS. 12A, 12B, 12C, 12D, and 12E are plan views illustrating various respective circuit boards to which an elastic connector is connected according to various embodiments of the disclosure.

Referring to FIG. 12A, when a camera module according to various embodiments is a dual camera module, first and second image sensors s1 and s2 may be disposed to a first circuit board 1240 (e.g., the first circuit board 640) so as to be spaced apart from each other. The first and second image sensors s1 and s2 may be disposed close to each other in consideration of a narrow mounting space of a mobile device.

In the camera module in which the first and second image sensors s1 and s2 according to various embodiments are disposed close to each other, when a first image sensor connection pad 12401 and a second image sensor connection pad 12402 are disposed close to each other, the connection structure using soldering or a conductive epoxy shown in FIG. 4 and FIG. 5 may not be possible due to the narrow mounting space.

However, a connection structure using the elastic connector 650 according to various embodiments of FIG. 6 and FIG. 7 (e.g., a connection structure between first and second connection pads) can couple connection pads of a housing respectively to the connection pads 12401 and 12402 of the first circuit board 1240 by using an elastic connector even if a space is narrow.

Figure 12B:
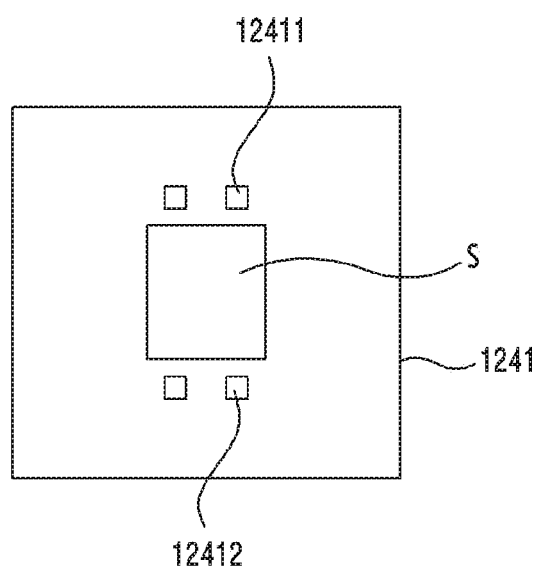

Referring to FIG. 12B, in a connection structure of a camera module using an elastic connector according to various embodiments, each of connection pads 12411 and 12412 (e.g., the connection pad 642) of a circuit board 1244 (e.g., the first circuit board 640) may be disposed to be symmetric about an image sensor s.

Figure 12C:
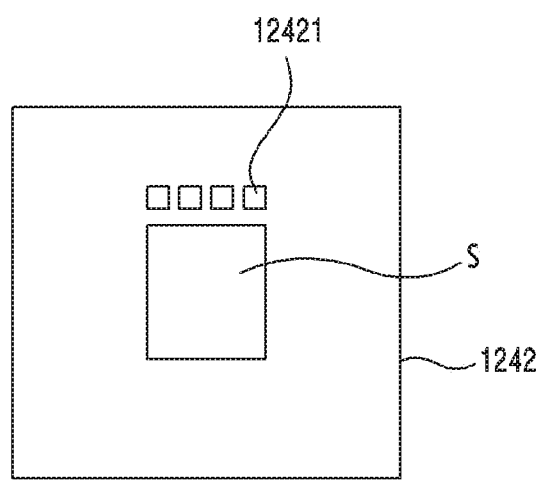

Referring to FIG. 12C, in a connection structure of a camera module using an elastic connector according to various embodiments, each connection pad 12421 (e.g., the connection pad 642) of a circuit board 1242 (e.g., the first circuit board 640) may be disposed side by side along one edge of an image sensor s. For example, each connection pad 12421 may be disposed asymmetrically about the image sensor s.

Figure 12D:
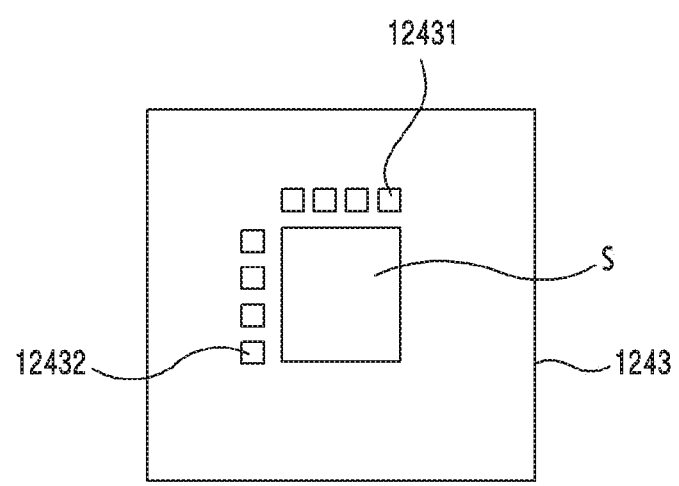

Referring to FIG. 12D, in a connection structure of a camera module using an elastic connector according to various embodiments, each of connection pads 12431 and 12432 (e.g., the connection pad 642) of a circuit board 1243 (e.g., the first circuit board 640) may be disposed side by side along two neighboring edges of an image sensor s. For example, each of the connection pads 12431 and 12432 may be disposed asymmetrically about the image sensor s.

Figure 12E:
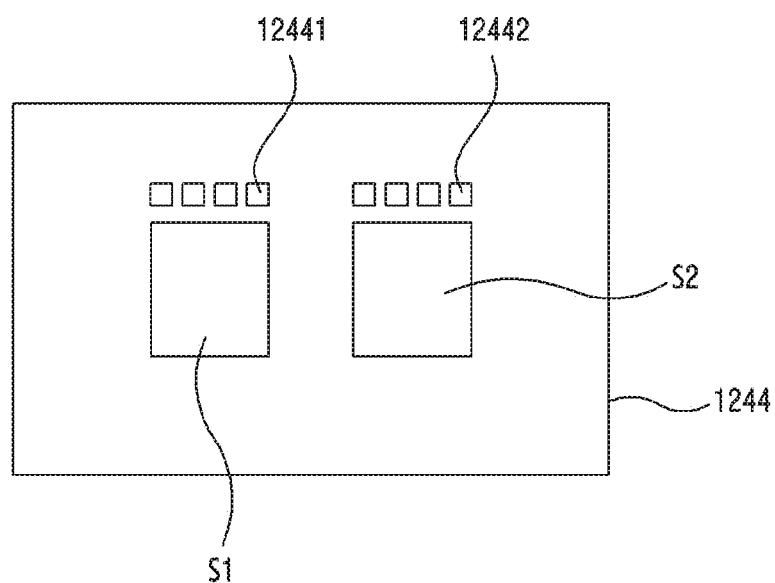

Referring to FIG. 12E, in a connection structure of a camera module using an elastic connector according to various embodiments, each of connection pads 12441 and 12442 (e.g., the connection pad 642) of a circuit board 1244 (e.g., the first circuit board 640) may be disposed side by side along respective edges of first and second image sensors s1 and s2. For example, each of the connection pads 12441 and 12442 may be disposed asymmetrically about the first and second image sensors s1 and s2.

Figure 13:
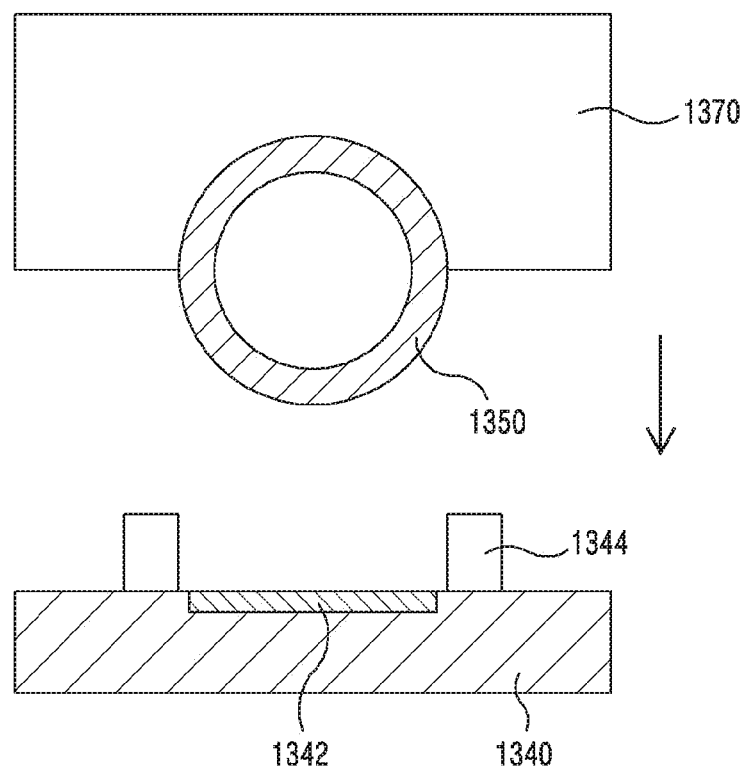
FIG. 13 is a cross-sectional view illustrating a state where an elastic connector is coupled to a circuit board by using a holder construction according to an embodiment of the disclosure.

FIG. 13 is a cross-sectional view illustrating a state where an elastic connector is coupled to a circuit board by using a holder construction according to an embodiment of the disclosure.

Referring to FIG. 13, when at least one elastic connector 1350 according to various embodiments is mounted to a first circuit board 1340 (e.g., a first circuit board 540) by using an SMD, a holder construction 1344 may be added. At least one holder construction 1344 may be disposed along a surrounding of each connection pad 1342 disposed to the first circuit board 1340. The elastic connector 1350 which is transferred by a holder 1370 of the SMD may be electrically coupled to the connection pad 1342 (e.g., the connection pad 642) by being mounted to the holder construction 1344 in an engagement manner.

For example, the elastic connector 1350 may be constructed in a cylindrical shape (see the elastic connector of FIG. 8D for example). The elastic connector 1350 may consist of a cylindrical elastic member and a metal film which surrounds at least part of an outer side of the elastic member.

The term "module," as used herein may represent, for example, a unit including a combination of one or two or more of hardware, software, or firmware. The "module" may be, for example, used interchangeably with the terms "unit", "logic", "logical block", "component", or "circuit" etc. The "module" may be the minimum unit of an integrally constructed component or a part thereof. The "module" may be also the minimum unit performing one or more functions or a part thereof. The "module" may be implemented mechanically or electronically. For example, the "module" may include at least one of an application-specific integrated circuit (ASIC) chip, field-programmable gate arrays (FPGAs) and a programmable-logic device performing some operations known to the art or to be developed in the future.

At least a part of an apparatus (e.g., modules or functions thereof) or method (e.g., operations) according to the disclosure may be, for example, implemented as instructions stored in a computer-readable storage medium in a form of a programming module. In case that the instruction is executed by a processor (e.g., processor 120), and the processor may perform functions corresponding to the instructions. The computer-readable storage media may be the memory 130, for instance.

The computer-readable recording medium may include a hard disk, a floppy disk, and a magnetic medium (e.g., a magnetic tape), an optical medium (e.g., a compact disc-read only memory (CD-ROM) and a digital versatile disc (DVD)), a Magneto-Optical Medium (e.g., a floptical disk), and a hardware device (e.g., a ROM (ROM), a random access memory (RAM), a flash memory, etc.). Also, the program instruction may include not only a mechanical language code such as a code made by a compiler but also a high-level language code executable by a computer using an interpreter, etc. The aforementioned hardware device may be constructed to operate as one or more software modules in order to perform operations of the disclosure, and vice versa.

The module or programming module according to the disclosure may include at least one or more of the aforementioned constituent elements, or omit some of the aforementioned constituent elements, or further include additional other constituent elements. Operations carried out by the module, the programming module or the other constituent elements according to the disclosure may be executed in a sequential, parallel, repeated or heuristic method. Also, some operations may be executed in different order or may be omitted, or other operations may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. A camera module comprising:
   an image sensor;
   a first circuit board comprising:
      the image sensor, and
      at least one first connection pad disposed along a surrounding of the image sensor;
   a housing comprising an actuator provided with at least one lens and a second circuit board comprising at least one second connection pad, the actuator is fixed on the first circuit board by moving along an optical axis; and
   one or more elastic connectors disposed between the first circuit board and the second circuit board to electrically couple the at least one second connection pad to the at least one first connection pad,
   wherein a largest area of contact of the at least one first connection pad with the one or more elastic connectors and a largest area of contact of the at least one second connection pad with the one or more elastic connectors face toward each other, and
   wherein each of the one or more elastic connectors is disposed in a compressed state between the at least one first connection pad and the at least one second connection pad according to a fixing structure between the first circuit board and the housing.

2. The camera module of claim 1, wherein the one or more elastic connectors are mounted on respective first connection pads of the first circuit board by using a surface mount device (SMD).

3. The camera module of claim 1, wherein an exterior of an elastic connector of the one or more elastic connectors comprises one of a cylindrical shape, a semi-cylindrical shape, or a hexahedral shape.

4. The camera module of claim 1, wherein the at least one second connection pad is configured to be:
   closely in contact with respective ones of the one or more elastic connectors, or
   detachable from the one or more elastic connectors, so that an examination of the camera module is possible.

5. The camera module of claim 1, wherein each of the one or more elastic connectors is mounted to the first circuit board, and thereafter, the second circuit board is electrically coupled to the first circuit board, so that an examination of the housing can be performed.

6. The camera module of claim 1, wherein the one or more elastic connectors comprises:
   an elastic member; and
   a metal film which surrounds at least part of an outer side of the elastic member.

7. The camera module of claim 6, wherein the metal film comprises a plurality of connector portions spaced apart from each other.

8. The camera module of claim 1, wherein the camera module is mounted to a front side or a rear side or a front/rear side of a mobile device.

9. The camera module of claim 1, wherein the camera module comprises any one of a single camera device or a dual camera device.

10. A mobile device comprising:
a housing comprising:
- a first side facing a first direction, and
- a second side facing a second direction opposite to the first direction; and at least one camera module mounted to at least one of the first side, the second side, or the first and second sides of the housing;

wherein the camera module comprises a lens housing for housing:
- a first circuit board comprising at least one first connection pad,
- a second circuit board comprising at least one second connection pad,
- an elastic member disposed between the first circuit board and the lens housing to electrically couple the at least one second connection pad to the at least one first connection pad, and
- one or more elastic connectors comprising a metal film surrounding at least part of an exterior of the elastic member, wherein a largest area of contact of the at least one first connection pad with the one or more elastic connectors and a largest area of contact of the at least one second connection pad with the one or more elastic connectors face toward each other, and wherein each of the one or more elastic connectors is disposed in a compressed state between the at least one first connection pad and the at least one second connection pad according to a fixing structure between the first circuit board and the housing.

11. The mobile device of claim 10, wherein the one or more elastic connectors are mounted on respective ones of the at least one first connection pad or the at least one second connection pad by using a surface mount device (SMD).

12. The mobile device of claim 10, wherein the one or more elastic connectors comprises any one of a hexahedral shape, a cylindrical shape, or a semi-cylindrical shape.

13. The mobile device of claim 10, wherein the elastic member is configured to:
- change shape when external pressure is applied, and
- return to its original state when the external pressure is removed.

* * * * *